(12) United States Patent
Nakazawa et al.

(10) Patent No.: US 10,942,201 B2
(45) Date of Patent: Mar. 9, 2021

(54) CURRENT DETECTOR AND CURRENT METER

(71) Applicant: HIOKI E.E. CORPORATION, Nagano (JP)

(72) Inventors: Koki Nakazawa, Nagano (JP); Kenta Ikeda, Nagano (JP); Yutaka Ashida, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 170 days.

(21) Appl. No.: 16/371,683

(22) Filed: Apr. 1, 2019

(65) Prior Publication Data

US 2019/0302152 A1    Oct. 3, 2019

(30) Foreign Application Priority Data

Apr. 3, 2018  (JP) .............................. JP2018-071395

(51) Int. Cl.
*G01R 19/00* (2006.01)
*G01R 15/18* (2006.01)

(52) U.S. Cl.
CPC ....... *G01R 19/0023* (2013.01); *G01R 15/181* (2013.01); *G01R 19/0007* (2013.01)

(58) Field of Classification Search
CPC . G01R 19/0007; G01R 19/28; G01R 19/0092
See application file for complete search history.

(56) References Cited

U.S. PATENT DOCUMENTS

| | | | | |
|---|---|---|---|---|
| 6,366,076 B1 * | 4/2002 | Karrer | ................. | G01R 15/181 324/117 R |
| 2008/0191705 A1 * | 8/2008 | Bellan | ................... | G01R 31/50 324/529 |
| 2011/0012587 A1 * | 1/2011 | Greenberg | .............. | G01R 1/22 324/114 |

FOREIGN PATENT DOCUMENTS

JP       2019-27970      2/2019

\* cited by examiner

*Primary Examiner* — Alvaro E Fortich
(74) *Attorney, Agent, or Firm* — Greenblum & Bernstein, P.L.C.

(57) ABSTRACT

A current detector includes: a current sensor that is constructed using a Rogowski coil, detects a current flowing in a measured object, and outputs a detection signal corresponding to a current value of the current; a transfer line that is constructed of a distributed constant line and transfers the detection signal; an impedance converting circuit that is provided between the current sensor and the transfer line and has an input impedance equal or substantially equal to a characteristic impedance of the current sensor; an integrator circuit that integrates the detection signal inputted via the transfer line and outputs an output signal indicating a current value of the current; and a resistance circuit that has a resistance value that is equal or substantially equal to a characteristic impedance of the transfer line and is connected in series between the transfer line and the integrator circuit.

12 Claims, 7 Drawing Sheets

CURRENT DETECTOR AND CURRENT METER

FIELD OF THE INVENTION

The present invention relates to a current detector that detects current flowing in a measured object and a current meter equipped with this current detector.

DESCRIPTION OF THE RELATED ART

As one example of a current meter of this type, the present applicant has disclosed a meter in Patent Literature 1 (Japanese Patent Application No. 2017-148958). This meter is constructed of a current sensor and a main body. The current sensor includes a Rogowski coil that is placed around a measured object and detects a measurement current flowing in the measured object, a damping resistance connected to an end portion of the Rogowski coil, and a connecting cable that connects the Rogowski coil and the main body, and outputs a voltage signal whose voltage value changes in proportion to the magnitude of changes over time in the current value of the current flowing in the measured object when the Rogowski coil is placed around the measured object. The main body includes an integrating circuit (or "integrator") that integrates the voltage signal inputted from the current sensor to generate a voltage signal with a voltage waveform that is proportional to the current waveform of the current flowing in the measured object, a processor that measures the current value of the measurement current flowing in the measured object based on the voltage signal generated by the integrating circuit, and an outputter that displays the current value measured by the processor on a screen. In this meter, by connecting the damping resistance to the Rogowski coil, it is possible to suppress the occurrence of peaks in the frequency characteristics that indicate the relationship between frequency and gain. By doing so, the usable band of the voltage signal outputted from the Rogowski coil (that is, a region composed of a differential region where the gain of the voltage signal rises as the frequency increases and a constant gain region where the gain is substantially constant) widens, and it becomes possible to output a voltage signal of a voltage waveform corresponding to the measurement current in this widened usable band.

SUMMARY OF THE INVENTION

However, the meter disclosed by the present applicant described above has the following problem to be solved. In more detail, as described above, the meter is configured with a damping resistance connected to the Rogowski coil to suppress the occurrence of peaks in the frequency characteristics and widen the usable band, which makes it possible to output a voltage signal of a voltage waveform corresponding to the current waveform of the measurement current in a wider usable band. However, with the meter described above, due to the influence of reflections caused by the mismatch between the characteristic impedance of the Rogowski coil and the characteristic impedance of a transmission line and the influence of reflections caused by the mismatch between the characteristic impedance of the transmission line and the input impedance of the integrator, there are cases where the frequency characteristics in a high-frequency region cease to be flat. The influence of such reflections becomes more prominent as the transmission line becomes longer. This means that depending on the length of the transmission line, it can be difficult for the meter described above to accurately measure the current value of a high-frequency current. There is demand for a solution to this problem.

The present invention was conceived in view of the problem described above and has a principal object of providing a current sensor and a current meter capable of accurately measuring a current value of a high-frequency current that flows in a measured object, regardless of the length of the transmission line.

To achieve the stated object, a current detector according to the present invention comprises: a current sensor that is constructed using a Rogowski coil, detects a current flowing in a measured object, and outputs a detection signal corresponding to a current value of the current; a transfer line that is constructed of a distributed constant line and transfers the detection signal; an impedance converting circuit that is provided between the current sensor and the transfer line and has an input impedance that is equal or substantially equal to a characteristic impedance of the current sensor; an integrator circuit that integrates the detection signal that is inputted via the transfer line and outputs an output signal indicating a current value of the current; and a resistance circuit that has a resistance value that is equal or substantially equal to a characteristic impedance of the transfer line and is connected in series between the transfer line and the integrator circuit.

A current meter according to the present invention comprises: the current detector described above; and a meter circuit that measures the current value based on the output signal outputted from the current detector.

In this way, according to the current detector and the current meter that is equipped with this current detector, by including the resistance circuit that has a resistance value that is equal or substantially equal to the characteristic impedance of the transfer line and is connected in series between the transfer line and the integrator circuit, it is possible to sufficiently reduce the influence of reflections due to the resistance value of the resistance circuit differing to the characteristic impedance of the transfer line, regardless of the length of the transfer line. Therefore, according to the current detector and the current meter described above, it is possible to keep the frequency characteristics in a high frequency region flat irrespective of the length of the transfer line, and as a result, it is possible to accurately measure the current value of a high-frequency current that flows in a measured object, regardless of the length of the transfer line.

Also, with a current detector according to the present invention, the impedance converting circuit has an output impedance that is equal or substantially equal to the characteristic impedance of the transfer line.

A current meter according to the present invention comprises: the current detector described above; and a meter circuit that measures the current value based on the output signal outputted from the current detector.

Also, according to the current detector and the current meter that is equipped with this current detector, by configuring the impedance converting circuit so as to have an input impedance that is equal or substantially equal to the characteristic impedance of the current sensor and an output impedance that is equal or substantially equal to the characteristic impedance of the transfer line, it is possible to match the characteristic impedance of the current sensor and the characteristic impedance of the transfer line. This means that according to the current detector and the current meter, compared for example to a configuration with an impedance converting circuit where the output impedance differs to the characteristic impedance of the transfer line, it is possible to further reduce the influence of reflections. Therefore, according to the current detector and the current meter, it is possible to make the frequency characteristics in a high-frequency region flatter, and as a result, it is possible to measure the current value of a high-frequency current more accurately.

Also, with a current detector according to the present invention, the impedance converting circuit is constructed of a resistor with a resistance value that is equal or substantially equal to the characteristic impedance of the current sensor and is connected in series between the current sensor and the transfer line.

A current meter according to the present invention comprises: the current detector described above; and a meter circuit that measures the current value based on the output signal outputted from the current detector.

In this way, according to the current detector and the current meter that is equipped with this current detector, by including the impedance converting circuit that is constructed of a resistor with a resistance value that is equal or substantially equal to the characteristic impedance of the current sensor and is connected in series between the current sensor and the transfer line, it is possible to simplify the circuit configuration of the impedance converting circuit. Also, according to the current detector and the current meter, compared for example to a configuration including the impedance converting circuit that has an input impedance equal to the characteristic impedance of the current sensor and an output impedance equal to the characteristic impedance of the transfer line, it is possible to suppress the drop in gain, which makes it possible to measure the current value more accurately.

Also, with a current detector according to the present invention, the integrator circuit is composed of an inverting active integrator circuit.

A current meter according to the present invention comprises: the current detector described above; and a meter circuit that measures the current value based on the output signal outputted from the current detector.

Also, according to the current detector and the current meter that is equipped with this current detector, by constructing the integrator circuit of an inverting active integrator circuit, compared to an integrator circuit constructed of a passive integrator circuit, it is possible to improve the integration characteristics, which means that the current value can be measured even more accurately.

It should be noted that the disclosure of the present invention relates to the contents of Japanese Patent Application No. 2018-071395 that was filed on Apr. 3, 2018, the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a current detector and a current meter will now be described with reference to the attached drawings.

Figure 1:
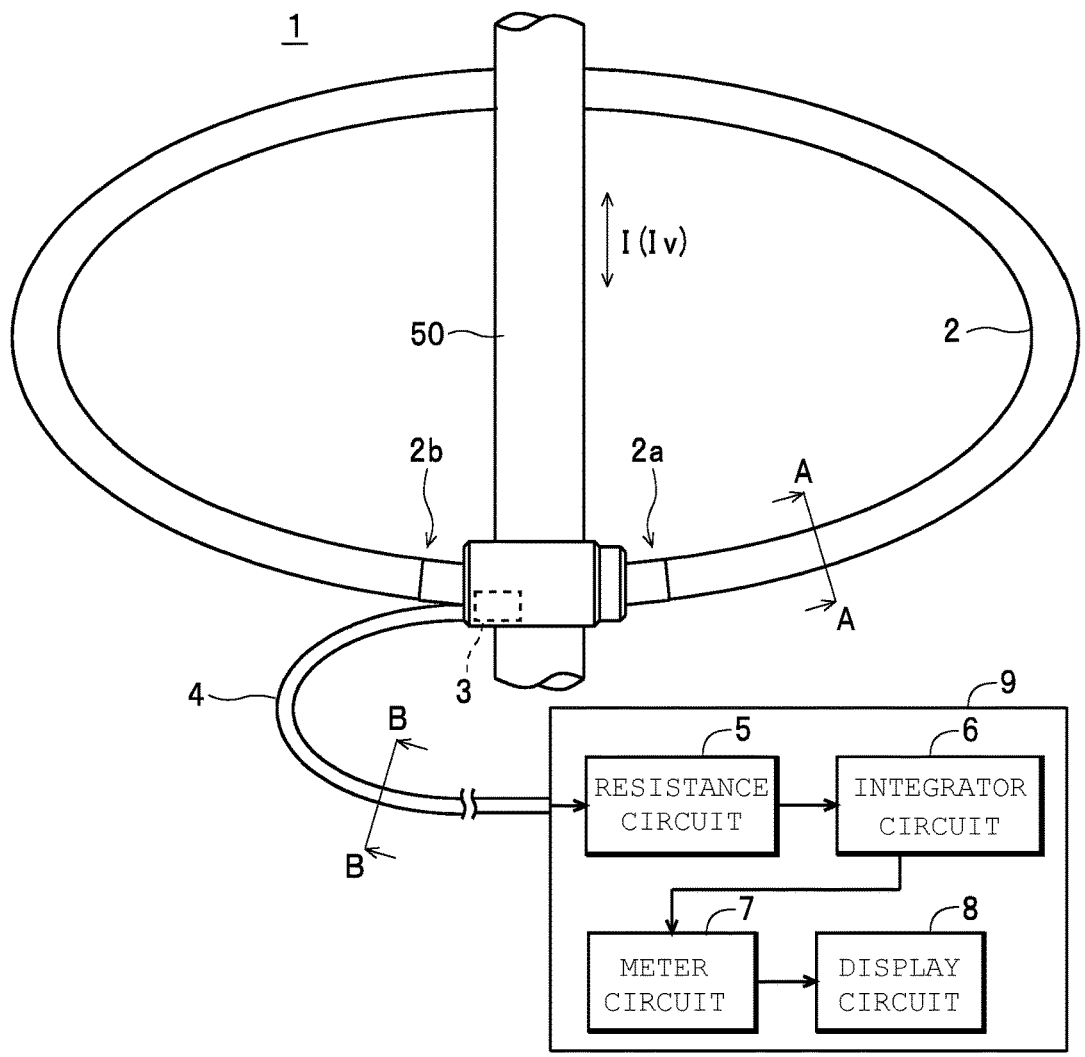
FIG. 1 is a block diagram depicting the configuration of a current meter 1.
Figure 3:
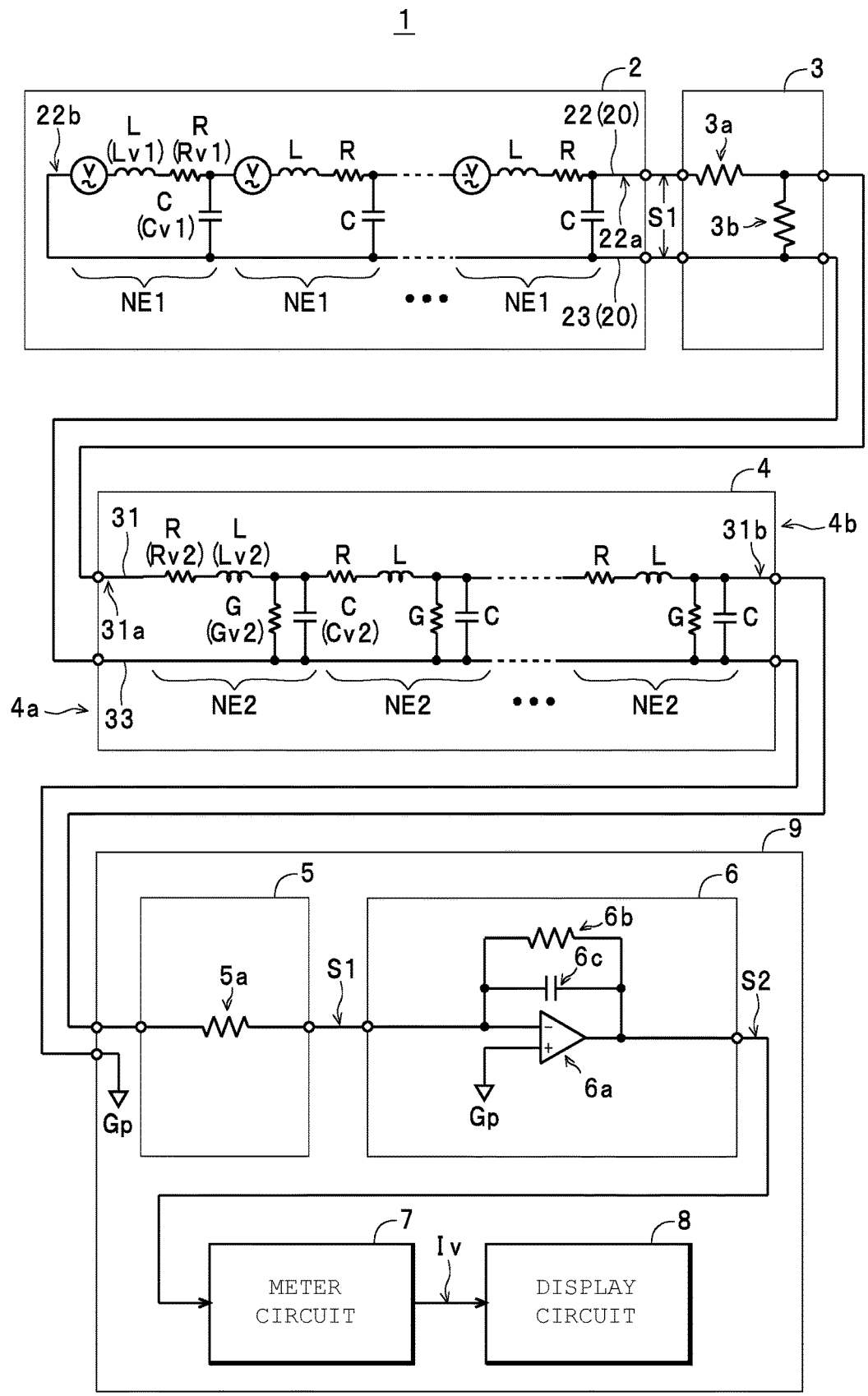
FIG. 3 is a circuit diagram of the current meter 1.

First, the configuration of a current meter 1 depicted in FIG. 1 will be described as one example of a current meter according to the present invention. The current meter 1 is configured so as to be capable of measuring a current value Iv of a current I flowing on a wire 50, which is one example of a measured object, without metallic contact. In more detail, as depicted in FIG. 1 and FIG. 3, the current meter 1 includes a current sensor 2, an impedance converting circuit 3, a connecting cable 4, a resistance circuit 5, an integrator circuit 6, a meter circuit 7, a display circuit 8, and a main case 9 that houses the resistance circuit 5, the integrator circuit 6, the meter circuit 7, and the display circuit 8. Note that the current sensor 2, the impedance converting circuit 3, the connecting cable 4, the resistance circuit 5, and the integrator circuit 6 construct a current detector.

The current sensor 2 is one example of a current sensor. The current sensor 2 is configured using a Rogowski coil so that when placed around the wire 50, the current sensor 2 detects the current I flowing on the wire 50 and outputs an induced voltage whose voltage value changes in proportion to the magnitude of a change over time (dIv/dt) of the current value Iv (that is, an induced voltage corresponding to the current value Iv) as a detection signal S1.

Figure 2:
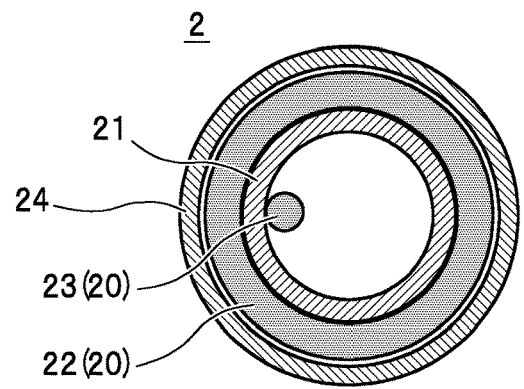
FIG. 2 is a cross-sectional view along a line A-A in FIG. 1.

In more detail, as depicted in FIG. 2, the current sensor 2 includes a winding core 21, a winding 22, a return line 23, and an insulating covering 24. As one example, the winding core 21 is formed in a flexible tubular shape using an insulating material, such as resin. The winding 22 extends from the base end side of the winding core 21 (the base end 2a side of the current sensor 2 depicted in FIG. 1) to the front end side (the front end portion 2b side of the current sensor 2 depicted in FIG. 1) and is formed by winding a covered conductor 20 that has low resistivity around the outer circumferential surface of the winding core 21. As depicted in FIG. 3, the return line 23 is formed by inserting the covered conductor 20, which has been pulled out from the front end 22b of the winding 22, back through the inside of the winding core 21 (see FIG. 2) from the front end side of the winding core 21 so as to return to the base end side of the winding core 21. The insulating covering 24 is formed of an insulating material, such as resin, and covers the winding 22.

As depicted in the equivalent circuit diagram in FIG. 3, the current sensor 2 is effectively equivalent to a configuration where distributed constant circuits NE1, which are each composed of a distributed voltage source V, a distributed inductance L, a distributed resistance R, and a distributed capacitance C, are cascaded in multiple stages. Here, since the wires used as the winding 22 and the return line 23 that construct the current sensor 2 have low resistivity as mentioned above, the resistance value Rv1 of the distributed resistance R is low enough to be negligible. This means that when the inductance value of the distributed inductance L is Lv1 and the capacitance value of the distributed capacitance C is Cv1, the characteristic impedance Z1 of the current sensor 2 is expressed by $\sqrt{(Lv1/Cv1)}$.

As depicted in FIG. 3, the impedance converting circuit 3 is provided between the current sensor 2 and one end 4a of the connecting cable 4. The impedance converting circuit 3 has an input impedance that is equal to the characteristic impedance Z1 of the current sensor 2 and has an output impedance that is equal to the characteristic impedance Z2 (the characteristic impedance Z2 will be described later) of the connecting cable 4, and therefore matches the characteristic impedance Z1 of the current sensor 2 and the characteristic impedance Z2 of the connecting cable 4. As one example, as depicted in FIG. 3, the impedance converting circuit 3 is configured so as to include two resistors 3a and 3b that are connected in an L shape. With this configuration, the resistor 3a is connected in series between the base end 22a of the winding 22 that constructs the current sensor 2 and one end 31a of a core wire 31, described later, of the connecting cable 4. One terminal of the resistor 3b is connected to one terminal of the resistor 3a (that is, the terminal connected to the core wire 31) and the other terminal is connected to the reference potential Gp of the main case 9 via a shield 33, described later, of the connecting cable 4.

Here, to make the input impedance of the impedance converting circuit 3 equal to the characteristic impedance Z1 of the current sensor 2 and the output impedance of the impedance converting circuit 3 equal to the characteristic impedance Z2 of the connecting cable 4 as described above, it is necessary, when looking at the connecting cable 4 from the current sensor 2, for a condition that the combined impedance of the respective resistance values of the resistors 3a and 3b in the impedance converting circuit 3 and the characteristic impedance Z2 is equal to the characteristic impedance Z1 to be satisfied and necessary, when looking at the current sensor 2 from the connecting cable 4, for a condition that the combined impedance of the respective resistance values of the resistors 3a and 3b in the impedance converting circuit 3 and the characteristic impedance Z1 is equal to the characteristic impedance Z2 to be satisfied. To do so, the resistance values of the resistors 3a and 3b are calculated by expressing the two conditions as simultaneous equations and substituting the characteristic impedance Z1 and the characteristic impedance Z2 into a calculation formula obtained by solving the simultaneous equations for the resistors 3a and 3b.

Note that it is not necessary for the input impedance of the impedance converting circuit 3 to be equal to the characteristic impedance Z1 of the current sensor 2, and it is also possible to use a configuration where the input impedance is substantially equal to the characteristic impedance Z1 (as one example, a configuration where the difference between the input impedance and the characteristic impedance Z1 is plus or minus 10% or less). Likewise, it is not necessary for the output impedance of the impedance converting circuit 3 to be equal to the characteristic impedance Z2 of the connecting cable 4, and it is also possible to use a configuration where the output impedance is substantially equal to the characteristic impedance Z2 (as one example, a configuration where the difference between the output impedance and the characteristic impedance Z2 is plus or minus 10% or less).

Figure 4:
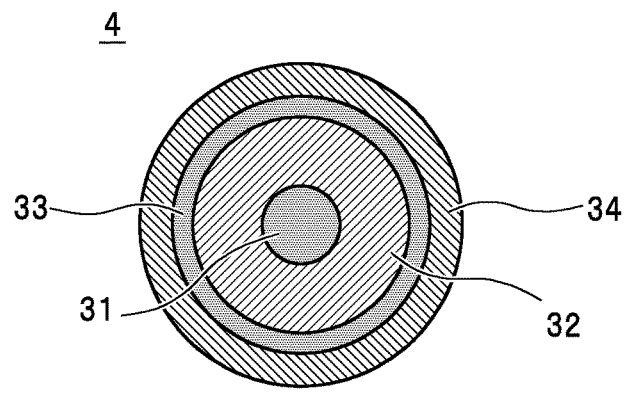
FIG. 4 is a cross-sectional view along a line B-B in FIG. 1.

The connecting cable 4 corresponds to a transmission line for transmitting the detection signal S1 and is composed of a coaxial cable as one example of a distributed constant line. In more detail, as depicted in FIG. 4, the connecting cable 4 includes the core wire 31, an insulating layer 32 that covers the circumference of the core wire 31, the shield 33 that is disposed around the insulating layer 32, and an insulating covering (or "sheath") 34 that covers the circumference of the shield 33. As depicted in the equivalent circuit diagram in FIG. 3, the connecting cable 4 is effectively equivalent to a configuration where distributed constant circuits NE2, which are each composed of a distributed resistance R, a distributed inductance L, a distributed conductance G, and a distributed capacitance C, are cascaded in multiple stages. Here, the resistance value Rv2 of the distributed resistance R is low enough to be negligible and the conductance value Gv2 of the distributed conductance G is large enough to be negligible. This means that when the inductance value of the distributed inductance L is Lv2 and the capacitance value of the distributed capacitance C is Cv2, the characteristic impedance Z2 of the connecting cable 4 in a lossless (or substantially lossless) frequency range is expressed by $\sqrt{(Lv2/Cv2)}$. In the current meter 1, as one example, a connecting cable 4 with a characteristic impedance Z2 of 50Ω is used.

As depicted in FIG. 3, the resistance circuit 5 is connected in series between the other end 4b of the connecting cable 4 and the integrator circuit 6. In more detail, as depicted in FIG. 3, the resistance circuit 5 is composed of a resistor 5a that is connected in series between the other end 31b of the core wire 31 of the connecting cable 4 and the inverting input terminal of an operational amplifier 6a that constructs the integrator circuit 6. In this configuration, the resistor 5a has a resistance value that is equal to the characteristic impedance Z2 of the connecting cable 4. Note that it is not necessary for the resistance value of the resistor 5a to be equal to the characteristic impedance Z2 of the connecting cable 4, and it is also possible to use a configuration where the resistance value is substantially equal to the characteristic impedance Z2 (as one example, a configuration where the difference between the resistance value and the characteristic impedance Z2 is plus or minus 10% or less). It is also possible to construct the resistance circuit 5 of a plurality of resistors.

As one example, the integrator circuit 6 is constructed of an inverting active integrator circuit. In more detail, as depicted in FIG. 3, the integrator circuit 6 includes the operational amplifier 6a whose non-inverting input terminal is connected to the ground potential Gp of the main case 9 and has a resistor 6b and a capacitor 6c connected in parallel between the inverting input terminal and the output terminal. The integrator circuit 6 integrates the detection signal S1 inputted via the connecting cable 4 and the resistance circuit 5 and generates and outputs a voltage signal, whose signal level changes in accordance with the current value Iv of the current I flowing on the wire 50 (i.e., has a voltage waveform proportional to the current waveform of the current I), as an output signal S2.

As one example, the meter circuit 7 includes an A/D converter circuit, a CPU, a memory, and the like (none of which are illustrated). In the meter circuit 7, the A/D converter circuit converts the output signal S2 outputted from the integrator circuit 6 into waveform data, and the CPU measures the current value Iv of the current I flowing on the wire 50 based on the waveform data.

As one example, the display circuit 8 is composed of a liquid crystal display and displays the current value Iv measured by the meter circuit 7.

Next, the operation of the current meter 1 will be described with reference to the drawings.

As one example, when measuring the current value Iv of the current I flowing on the wire 50 depicted in FIG. 1, the current sensor 2 is placed around the wire 50 as depicted in the drawing. In this state, the current sensor 2 detects the current I flowing on the wire 50 and outputs an induced voltage, whose voltage value changes in proportion to the magnitude of the change over time (dIv/dt) of the current value Iv of the current I, as the detection signal S1.

Next, as depicted in FIG. 3, the detection signal S1 is inputted into the integrator circuit 6 via the impedance converting circuit 3, the connecting cable 4, and the resistance circuit 5 of the current meter 1. After this, the integrator circuit 6 integrates the inputted detection signal S1 to generate and output a voltage signal, whose signal level changes in accordance with the current value of the current I flowing on the wire 50, that is, a signal with a voltage waveform proportional to the current waveform of the current I, as the output signal S2. Next, the meter circuit 7 measures the current value Iv of the current I flowing on the wire 50 based on the output signal S2. After this, the display circuit 8 displays the current value Iv. By doing so, measurement of the current value Iv is complete.

Figure 5:
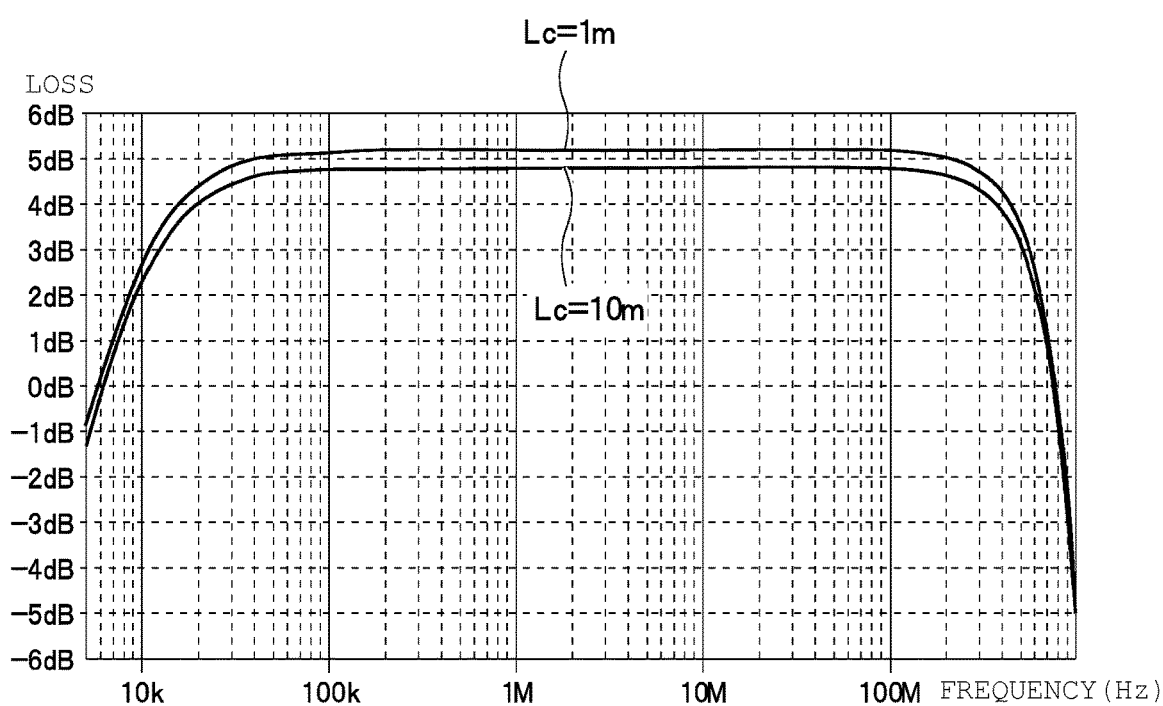
FIG. 5 is a frequency characteristics diagram depicting frequency characteristics of the current meter 1.

Here, in order to verify the effect of the current meter 1, the present inventors calculated frequency characteristics indicating the relationship between the frequency and gain of the output signal S2 by simulation using the equivalent circuit depicted in FIG. 3. In this simulation, it was assumed that thirty of the distributed constant circuits NE1 are connected in a cascade in an equivalent circuit of the current sensor 2 depicted in the drawing, that the inductance value Lv1 of the distributed inductance L in each distributed constant circuit NE1 is 8 nH, that the capacitance value Cv1 of the distributed capacitance C is 0.17 pF, and the resistance value Rv1 of the distributed resistance R is 1.2Ω. In addition, the characteristic impedance Z1 of the current sensor 2 calculated from the inductance value Lv1, the capacitance value Cv1, and the resistance value Rv1 set in this way was calculated as 219Ω. The characteristic impedance Z2 of the connecting cable 4 was assumed to be 50Ω. Resistance values of the resistors 3*a* and 3*b* that satisfy the condition that a combined impedance produced by combining the resistance values of the resistors 3*a* and 3*b* of the impedance converting circuit 3 and the characteristic impedance Z2 is equal to the characteristic impedance Z1 and a combined impedance produced by combining the resistance values of the resistors 3*a* and 3*b* and the characteristic impedance Z1 is equal to the characteristic impedance Z2 were calculated as 192Ω and 56.8Ω, respectively. The resistance value of the resistor 5*a* in the resistance circuit 5 was assumed to be 50Ω, which is equal to the characteristic impedance Z2. The resistance value of the resistor 6*b* that constructs the integrator circuit 6 was assumed to be 1MΩ and the capacitance value of the capacitor 6*c* was assumed to be 20 pF. FIG. 5 depicts the simulation results of two sets of frequency characteristics for when the values given above were set and the length Lc of the connecting cable 4 was set at 1 m and at 10 m.

Figure 6:
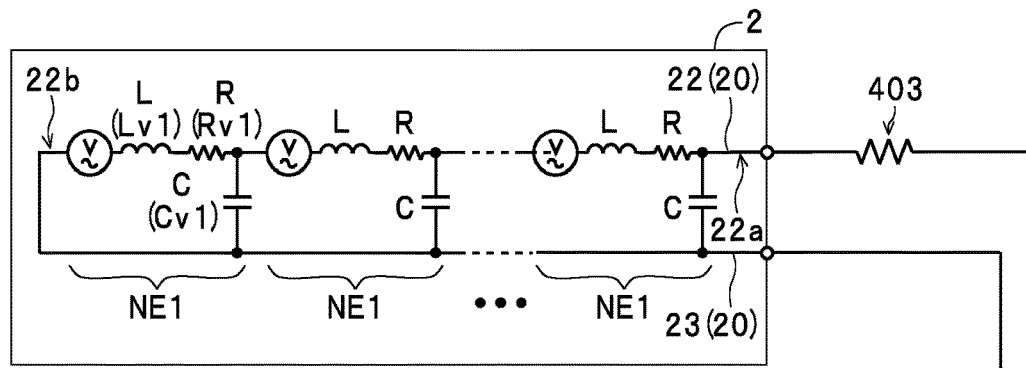
FIG. 6 is a circuit diagram of a current meter 400.
Figure 6:
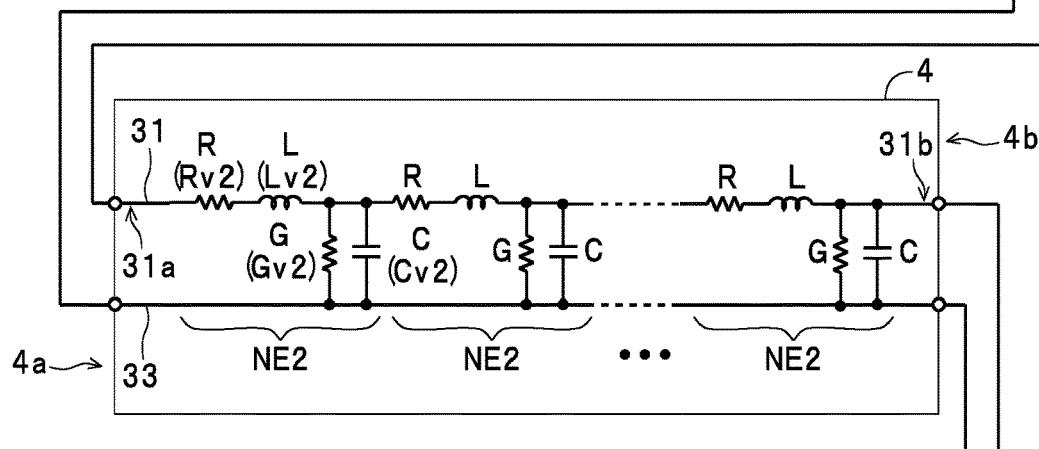
Figure 6:
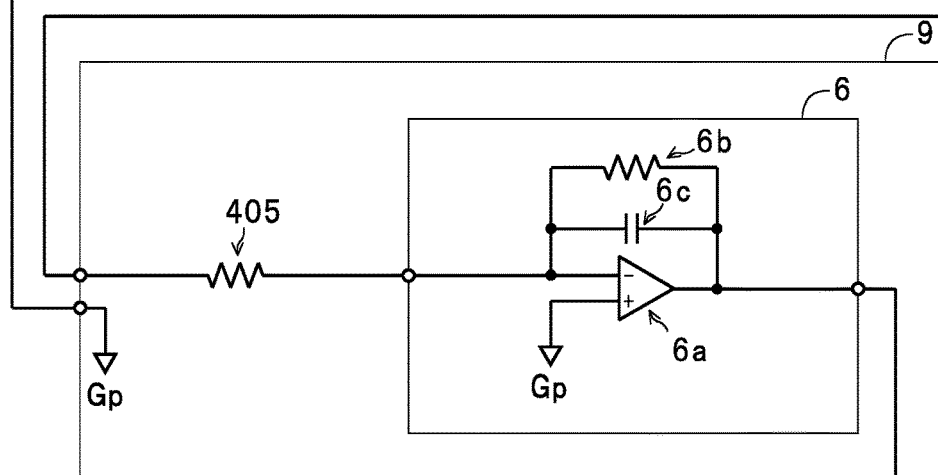
Figure 6:
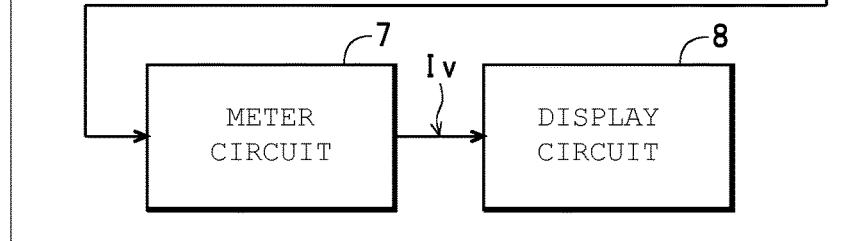
Figure 7:
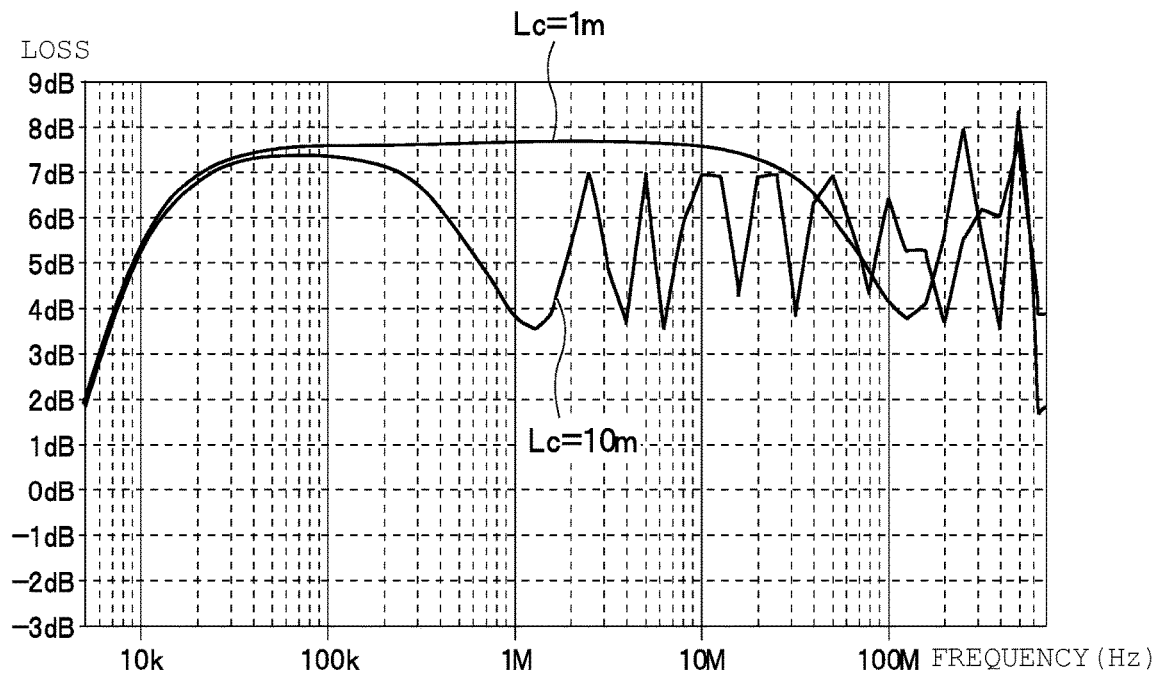
FIG. 7 is a frequency characteristics diagram depicting frequency characteristics of the current meter 400.

As a comparative example, frequency characteristics were calculated by simulation using an equivalent circuit of a current meter 400 depicted in FIG. 6 (that is, a conventional current meter). As depicted in FIG. 6, the current meter 400 is configured using a resistor 403 in place of the impedance converting circuit 3 of the current meter 1 and a resistor 405 in place of the resistance circuit 5. In this simulation, the resistance value of the resistor 403 was assumed to be 219Ω, the resistance value of the resistor 405 was assumed to be 100Ω, which differs to the characteristic impedance Z2 of the connecting cable 4, and the other values were assumed to be the same as the values used in the simulation of the current meter 1. FIG. 7 depicts the simulation results of two sets of frequency characteristics for when the values given above were set and the length Lc of the connecting cable 4 was set at 1 m and at 10 m.

As should be clear from FIG. 7, when the resistance value of the resistor 405 differs to the characteristic impedance Z2 of the connecting cable 4, there is a loss of flatness in the frequency characteristics in the high frequency region, and the gain greatly fluctuates as the frequency increases and decreases. The extent of the fluctuations (or "fluctuation amplitude") is larger when the length Lc of the connecting cable 4 is longer. On the other hand, with the current meter 1 where the resistance value of the resistance circuit 5 (the resistor 5*a*) is equal to the characteristic impedance Z2 of the connecting cable 4, as should be clear from FIG. 5, the frequency characteristics remain flat even in a high frequency region regardless of the length Lc of the connecting cable 4. It is thought that this happens because setting the resistance value of the resistance circuit 5 equal to the characteristic impedance Z2 of the connecting cable 4 sufficiently lowers the influence of reflections caused when such values differ, regardless of the length Lc of the connecting cable 4.

In this way, according to the current detector and the current meter 1, by including the resistance circuit 5 that has a resistance value that is equal (or substantially equal) to the characteristic impedance Z2 of the connecting cable 4 and is connected in series between the connecting cable 4 and the integrator circuit 6, it is possible to sufficiently reduce the influence of reflections due to the resistance value of the resistance circuit 5 differing to the characteristic impedance Z2 of the connecting cable 4, regardless of the length of the connecting cable 4. Therefore, according to the current detector and current meter 1, it is possible to keep the frequency characteristics in a high frequency region flat irrespective of the length of the connecting cable 4, and as a result, it is possible to accurately measure the current value Iv of a high-frequency current I that flows in a measured object, regardless of the length of the connecting cable 4.

Also, according to the current detector and the current meter 1, by configuring the impedance converting circuit 3 so as to have an input impedance that is equal (or substantially equal) to the characteristic impedance Z1 of the current sensor 2 and an output impedance that is equal (or substantially equal) to the characteristic impedance Z2 of the connecting cable 4, it is possible to match the characteristic impedance Z1 of the current sensor 2 and the characteristic impedance Z2 of the connecting cable 4. This means that according to the current detector and the current meter 1, compared for example to a configuration with an impedance converting circuit where the output impedance differs to the characteristic impedance Z2, it is possible to further reduce the influence of reflections. Therefore, according to the current detector and the current meter 1, it is possible to make the frequency characteristics in a high-frequency region flatter, and as a result, it is possible to measure the current value Iv of a high-frequency current I more accurately.

Also, according to the current detector and the current meter 1, by constructing the integrator circuit 6 of an inverting active integrator circuit, compared to an integrator circuit constructed of a passive integrator circuit, it is possible to improve the integration characteristics, which means that the current value Iv can be measured even more accurately.

Note that the configurations of the current detector and the current meter are not limited to the configurations described above. As one example, although an example configuration equipped with the impedance converting circuit 3 that includes the resistors 3a and 3b has been described above, as depicted in FIG. 8, it is possible to configure a current meter 101 which includes, in place of the impedance converting circuit 3, an impedance converting circuit 103 that is constructed of a single resistor 103a with a resistance value that is equal (or substantially equal) to the characteristic impedance Z1 of the current sensor 2 and is connected in series between the current sensor 2 and the connecting cable 4. Note that the connecting cable 4, the resistance circuit 5, the integrator circuit 6, the meter circuit 7, the display circuit 8, and the main case 9 have been omitted from FIG. 8. Component elements that have the same functions as the component elements of the current meter 1 described above have been assigned the same reference numerals and duplicated description thereof is omitted.

Figure 8:
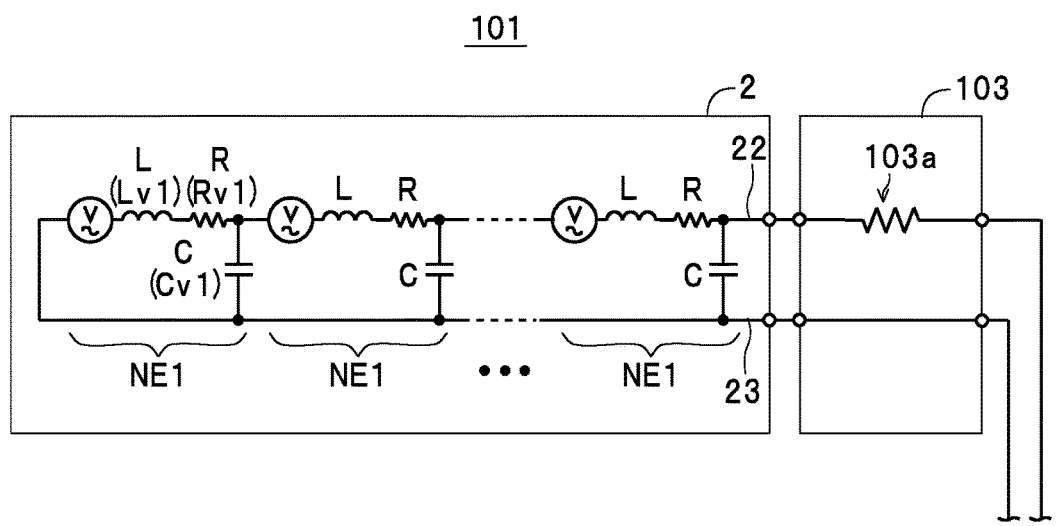
FIG. 8 is a circuit diagram of a current meter 101.
Figure 9:
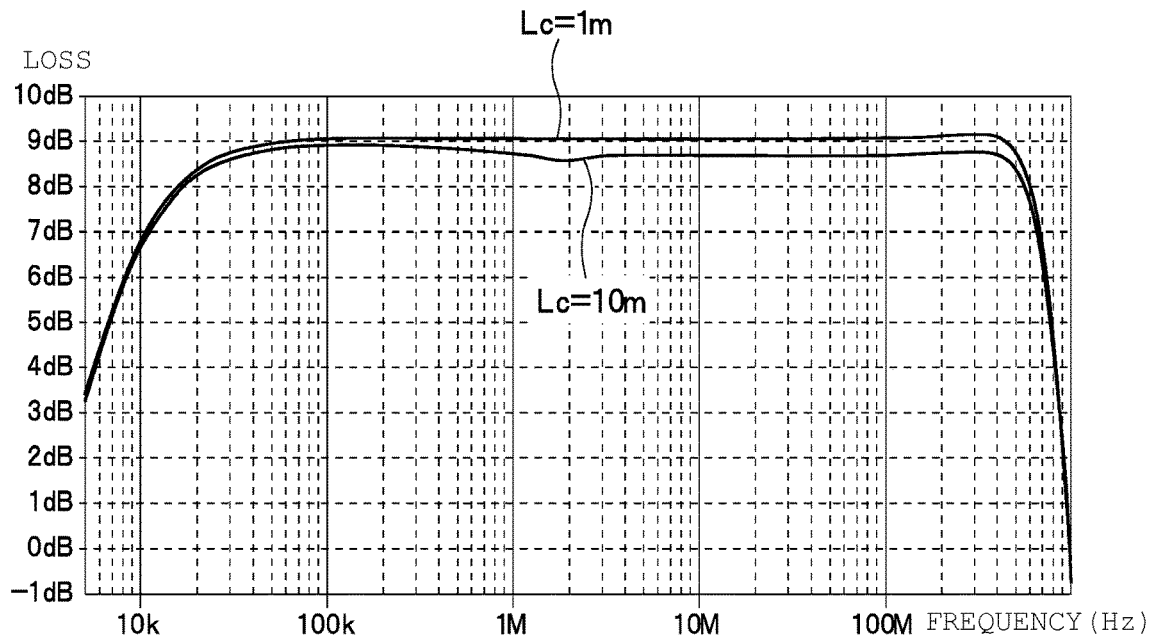
FIG. 9 is a frequency characteristics diagram depicting frequency characteristics of the current meter 101.

FIG. 9 depicts simulation results calculated by simulating frequency characteristics indicating the relationship between the frequency and gain of the output signal S2 using an equivalent circuit of the current meter 101 depicted in FIG. 8. Here, the resistance value of the resistor 103a was set at 219Ω, which is the same as the characteristic impedance Z1 of the current sensor 2, the other values were set at the same values as the respective values in the simulation for the current meter 1 described above, and two sets of frequency characteristics were obtained by simulation for when the length Lc of the connecting cable 4 was set at 1 m and at 10 m. As should be clear from FIG. 9, for the current meter 101 also, compared to the frequency characteristics of the current meter 400 as the comparative example described above (see FIG. 5), it is possible to keep the frequency characteristics in a high frequency region flat regardless of the length Lc of the connecting cable 4. This means that with the current meter 101 also, it is possible to accurately measure the current value Iv of a high-frequency current I that flows in a measured object, regardless of the length Lc of the connecting cable 4. Additionally, according to the current meter 101, by including the impedance converting circuit 103 that is constructed of a single resistor 103a in place of the impedance converting circuit 3, it is possible to simplify the circuit configuration of the impedance converting circuit 103. Also, according to the current meter 101, compared to a configuration including the impedance converting circuit 3 that has an input impedance equal to the characteristic impedance Z1 of the current sensor 2 and an output impedance equal to the characteristic impedance Z2 of the connecting cable 4, it is possible to suppress the drop in gain, which makes it possible to measure the current value Iv more accurately.

Figure 10:
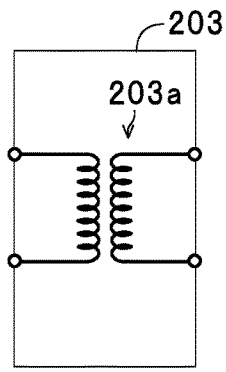
FIG. 10 is a circuit diagram of an impedance converting circuit 203.
Figure 11:
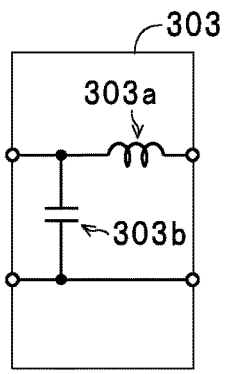
FIG. 11 is a circuit diagram of an impedance converting circuit 303.
Figure 12:
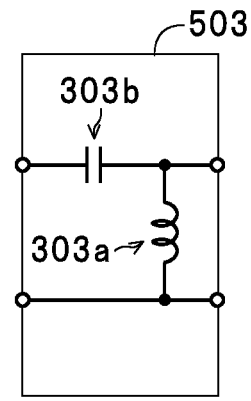
FIG. 12 is a circuit diagram of an impedance converting circuit 503.

Although an example equipped with the impedance converting circuit 3, in which two resistors 3a and 3b are connected in an L shape, has been described above, it is also possible to use a configuration equipped with an impedance converting circuit that includes three or more resistors. Also, as depicted in FIG. 10, it is possible to use a configuration equipped with an impedance converting circuit 203 constructed of a transformer 203a. With this configuration, by setting the turn ratio of the primary winding and the secondary winding so that the impedance of the primary winding (that is, the winding connected to the current sensor 2) of the transformer 203a becomes equal to the characteristic impedance Z1 of the current sensor 2 and the impedance of the secondary winding (that is, the winding connected to the connecting cable 4) becomes equal to the characteristic impedance Z2 of the connecting cable 4, it is possible to match the characteristic impedance Z1 of the current sensor 2 and the characteristic impedance Z2 of the connecting cable 4. Also, as depicted in FIGS. 11 and 12, it is possible to use a configuration including impedance converting circuits 303 and 503 that include an inductor 303a and a capacitor 303b connected in an L shape. It is also possible to use a configuration equipped with an impedance converting circuit including one or more of resistor(s), inductor(s), or capacitor(s) that are connected in a T-shape or a pi-shape.

Figure 13:
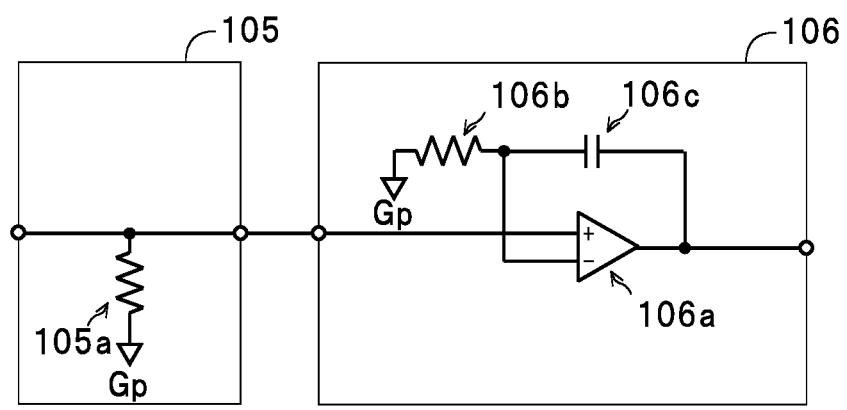
FIG. 13 is a circuit diagram of a resistance circuit 105 and an integrator circuit 106.

Also, although an example that uses the integrator circuit 6 constructed of an inverting active integrator circuit has been described above, as depicted in FIG. 13, it is also possible to use an integrator circuit 106 constructed of a non-inverting active integrator circuit including an operational amplifier 106a, a resistor 106b, and a capacitor 106c. Here, when the integrator circuit 106 constructed of a non-inverting active integrator circuit is used, as depicted in FIG. 13, by using a resistance circuit 105 constructed of a resistor 105a that has one terminal connected to a non-inverting input terminal of the operational amplifier 106a, has another terminal connected to the ground potential Gp of the main case 9, and has a resistance value equal to the characteristic impedance Z2 of the connecting cable 4, it is possible to realize the same effects as the current meters 1 and 101 described above. It is also possible to use an integrator circuit constructed of a passive integrator circuit in place of an active integrator circuit.

Although an example that uses a connecting cable 4 with a characteristic impedance Z2 of 50Ω has been described above, it is also possible to use a connecting cable 4 with a characteristic impedance Z2 of another arbitrary value. Also, although an example where a coaxial cable as one example of a distributed constant line is used as the connecting cable 4 has been described above, it is also possible to use a distributed constant line aside from a coaxial cable (for example, a two-wire parallel transmission line) as the connecting cable 4.

Although an example configuration including the display circuit 8 that displays a current value Iv measured by the meter circuit 7 has been described above, it is also possible to use a configuration that does not include the display circuit 8 and has an external display circuit display the current value Iv. It is also possible to use a configuration that is equipped with storage and stores data indicating the current value Iv in the storage and/or a configuration that is equipped with a writer that writes data onto a removable medium and writes data indicating the current value Iv from the writer onto the removable medium. It is also possible to use a configuration that includes a network interface circuit and transfers data indicating the current value Iv to an external apparatus via a network.

What is claimed is:

1. A current detector comprising:
a current sensor that is constructed using a Rogowski coil, detects a current flowing in a measured object, and outputs a detection signal corresponding to a current value of the current;
a transfer line that is constructed of a distributed constant line and transfers the detection signal;
an impedance converting circuit that is provided between the current sensor and the transfer line and has an input impedance that is equal or substantially equal to a characteristic impedance of the current sensor;
an integrator circuit that integrates the detection signal that is inputted via the transfer line and outputs an output signal indicating a current value of the current; and
a resistance circuit that has a resistance value that is equal or substantially equal to a characteristic impedance of the transfer line and is connected in series between the transfer line and the integrator circuit.

2. The current detector according to claim 1,
wherein the impedance converting circuit has an output impedance that is equal or substantially equal to the characteristic impedance of the transfer line.

3. The current detector according to claim 1,
wherein the impedance converting circuit is constructed of a resistor with a resistance value that is equal or substantially equal to the characteristic impedance of the current sensor and is connected in series between the current sensor and the transfer line.

4. The current detector according to claim 1,
wherein the integrator circuit is composed of an inverting active integrator circuit.

5. The current detector according to claim 2,
wherein the integrator circuit is composed of an inverting active integrator circuit.

6. The current detector according to claim 3,
wherein the integrator circuit is composed of an inverting active integrator circuit.

7. A current meter comprising:
a current detector according to claim 1; and
a meter circuit that measures the current value based on the output signal outputted from the current detector.

8. A current meter comprising:
a current detector according to claim 2; and
a meter circuit that measures the current value based on the output signal outputted from the current detector.

9. A current meter comprising:
a current detector according to claim 3; and
a meter circuit that measures the current value based on the output signal outputted from the current detector.

10. A current meter comprising:
a current detector according to claim 4; and
a meter circuit that measures the current value based on the output signal outputted from the current detector.

11. A current meter comprising:
a current detector according to claim 5; and
a meter circuit that measures the current value based on the output signal outputted from the current detector.

12. A current meter comprising:
a current detector according to claim 6; and
a meter circuit that measures the current value based on the output signal outputted from the current detector.

* * * * *